United States Patent
Yen et al.

(10) Patent No.: US 12,369,263 B2
(45) Date of Patent: Jul. 22, 2025

(54) RETRACTABLE SCREEN MOBILE DEVICE

(71) Applicant: SYNCMOLD ENTERPRISE CORP., New Taipei (TW)

(72) Inventors: Ching-Hui Yen, New Taipei (TW); Chun-Hao Huang, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 484 days.

(21) Appl. No.: 18/072,269

(22) Filed: Nov. 30, 2022

(65) Prior Publication Data
US 2023/0208959 A1   Jun. 29, 2023

Related U.S. Application Data

(60) Provisional application No. 63/293,457, filed on Dec. 23, 2021.

(30) Foreign Application Priority Data

Sep. 14, 2022   (TW) .................................. 111209994

(51) Int. Cl.
*H05K 5/02* (2006.01)
*H04M 1/02* (2006.01)

(52) U.S. Cl.
CPC ........ *H05K 5/0217* (2013.01); *H04M 1/0268* (2013.01)

(58) Field of Classification Search
CPC . H05K 5/0217; H04M 1/0268; H04M 1/0237
See application file for complete search history.

(56) References Cited

U.S. PATENT DOCUMENTS

2023/0209745 A1* 6/2023 Yen ..................... H04M 1/0268
                                                                361/807

* cited by examiner

*Primary Examiner* — Myron Wyche
(74) *Attorney, Agent, or Firm* — MUNCY, GEISSLER, OLDS & LOWE, P.C.

(57) ABSTRACT

A retractable screen mobile device comprises a main unit, a retractable unit, an elastic member, and a flexible display screen. The retractable unit is disposed on the main unit along a telescopic axis, and both ends of the elastic member are respectively disposed on the main unit and the retractable unit; wherein the retractable unit can be shifted between a retracted state and an outstretched state relative to the main unit, and thereby change the display area of the flexible display screen.

13 Claims, 9 Drawing Sheets

RETRACTABLE SCREEN MOBILE DEVICE

CROSS REFERENCE TO RELATED APPLICATION

This application claims the benefit of U.S. Provisional Application Ser. No. US 63/293,457 filed on Dec. 23, 2021, and the benefit of Taiwan Patent Application Serial No. 111209994 filed on Sep. 14, 2022. The entirety of each Application is incorporated herein by reference.

BACKGROUND OF THE INVENTION

1. Field of the Invention

The present invention relates to a retractable screen mobile device especially a retractable screen mobile device for a flexible display screen.

2. Description of Related Art

Conventional mobile devices often focus on the requirements of lightness and thinness. As a result, the size of the display screen of the mobile device is limited. However, with the development of mobile devices, users' demand for large-size display screens has increased rapidly. Therefore, many related products that can expand the size of the display screen have been published in recent years, that is, the display screen area can be increased when the mobile device is used but still meet the requirements of light and thin when the mobile device is carried and stored.

However, during the transition between the unfolded and retracted states of the flexible display screen, the tensile stress generated or material fatigue may easily lead to creases, damages, or cracks in the flexible display screen.

Therefore, a main objective of the present invention is to provide a mobile device with a retractable display screen, which can be selectively switched between the outstretched and retracted states according to the needs during the use.

SUMMARY OF THE INVENTION

An objective of the present invention is to provide a retractable screen mobile device, wherein the retractable screen mobile device comprises a main unit, including a first shell, a first supporting plate, and an accommodating space, wherein the first supporting plate is disposed on the first shell and has a first supporting surface and a plurality of first comb-tooth columns, the first comb-tooth columns extend along a telescopic axis and a first gap is formed between two adjacent first comb-tooth columns, and the accommodating space is surrounded and defined by the first shell and the first supporting plate; a retractable unit, slidably disposed on the main unit along the telescopic axis and converted between a retracted state and an outstretched state with respect to the main unit, the retractable unit includes a second shell, a damping element, a pivot, a second supporting plate, and a connecting plate, wherein the damping element connects the second shell; the connecting plate is disposed on the second shell; the second supporting plate is hung on the pivot and has a second supporting surface and a plurality of second comb-tooth columns, wherein the second supporting surface and the first supporting surface is coplanar to each other, a width of each of the second comb-tooth columns is slightly smaller than a width of the first gap, the first comb-tooth column and the second comb-tooth column are correspondingly staggered and can slide relative to each other; an elastic member with two ends respectively disposed on the main unit and the retractable unit; at least one constant force spring, including a winding part and a telescopic part, wherein the winding part is disposed on the first shell; and a flexible display screen, including a fixed end and a free end, wherein the fixed end is disposed on the first supporting plate, the flexible display screen covers the first supporting surface and is wound and deflected around the pivot, the free end is fixed to the telescopic part of the constant force spring, wherein the constant force spring provides constant tension on the flexible display screen; wherein the pivot and the first shell are closest to each other and the second supporting plate is in a assembly position, the first comb-tooth columns and the second comb-tooth columns are completely complementary and jointly define a minimal area, the first supporting surface and the second supporting surface substantially coincide and jointly support the flexible display screen when the retractable unit is in the retracted state; the pivot and the first shell are farthest away from each other, the second supporting plate is in an extended position, the first comb-tooth columns and the second comb-tooth columns are partially engaged and jointly define a maximum area, the first supporting surface and the second supporting surface partially coincide to each other and jointly support the flexible display screen when the retractable unit is in the outstretched state; and the damping element provides a damping force when the retractable unit moves with respect to the main unit.

In one embodiment, the damping element is disposed in the pivot and extended in a steering axis, which is substantially perpendicular to the telescopic axis, and has an inner tube, wherein the inner tube passes through the pivot and two ends of the inner tube are respectively fixed on the second shell, the second supporting plate is hung on the pivot so that the pivot rotates relative to the inner tube and provides the damping force when the retractable unit moves along the telescopic axis with respect to the main unit.

In one embodiment, the damping element further has a filling area, a damping oil, and two oil seals, wherein the filling area is sandwiched between the pivot and the inner tube, the damping oil is filled in the filling area, and the oil seals are respectively disposed at both ends of the filling area to seal the damping oil in the filling area.

In one embodiment, the damping element is a damping rod, the damping rod abuts between the first shell and the second shell and provides the damping force when the retractable unit moves along the telescopic axis with respect to the main unit.

In one embodiment, the second supporting plate has at least one hook part, the pivot has at least one hook groove for the at least one hook part to correspondingly hung thereon.

In one embodiment, the main unit further has a plurality of abutting plates, each of the abutting plates is correspondingly disposed on one of the first comb-tooth columns, and extends along outwardly perpendicular to the telescopic axis to support each of the second comb-tooth columns respectively.

In one embodiment, the first supporting plate further has a first elongated plate, the second supporting plate further has a second elongated plate, the first comb-tooth columns are disposed on one side of the first elongated plate, the second comb-tooth columns are disposed on one side of the second elongated plate that adjacent to the first elongated plate, the at least one hook part is disposed on another side of the second elongated plate that is away from the first elongated plate.

In one embodiment, a distance between the first elongated plate and the second elongated plate is the smallest when the retractable unit is in the retracted state; the distance between the first elongated plate and the second elongated plate is the largest when the retractable unit is in the outstretched state.

In one embodiment, the elastic member includes a first end and a second end, the first end is fixed on the first shell, the second end is fixed on the retractable unit, and the elastic member tends to maintain the retractable unit in the outstretched state.

In one embodiment, the flexible display screen includes a fixed display area and an extended display area, wherein the fixed display area is constantly supported by the first supporting surface, the extended display area is partially supported by the second supporting surface and partially wound around the pivot when the retractable unit is in the outstretched state; and the extended display area is partially wound around the pivot and partially accommodated in the accommodating space when the retractable unit is in the retracted state.

In one embodiment, the retractable screen mobile device further comprises a locking element, when the locking element is in a locked state, the retractable unit is kept in the retracted state, and when the locking element is in an unlocked state, the elastic member pushes the retractable unit so that the retractable unit tends to remain in the outstretched state.

In one embodiment, the locking element includes a hook, a tenon, and a button, wherein the hook is attached to the connecting plate, the tenon and the button are disposed on the first shell; the hook and the tenon are engaged with each other in the locked state, and the hook and the tenon are separated and switched to the unlocked state when the button is pressed.

In one embodiment, the elastic member is a torsional spring with two ends respectively disposed on the first shell and the second shell.

DETAILED DESCRIPTION OF THE PREFERRED EMBODIMENT

Reference will now be made in detail to the present embodiments of the invention, examples of which are illustrated in the accompanying drawings, and are not intended to limit the present invention, applications, or implementations described in these embodiments. Wherever possible, the same reference numbers are used in the drawings and the description to refer to the same or like parts. It shall be appreciated that, in the following embodiments and the attached drawings, elements unrelated to the present invention are omitted from depiction; and dimensional relationships among individual elements in the attached drawings are provided only for ease of understanding, but not to limit the actual scale.

Figure 1:
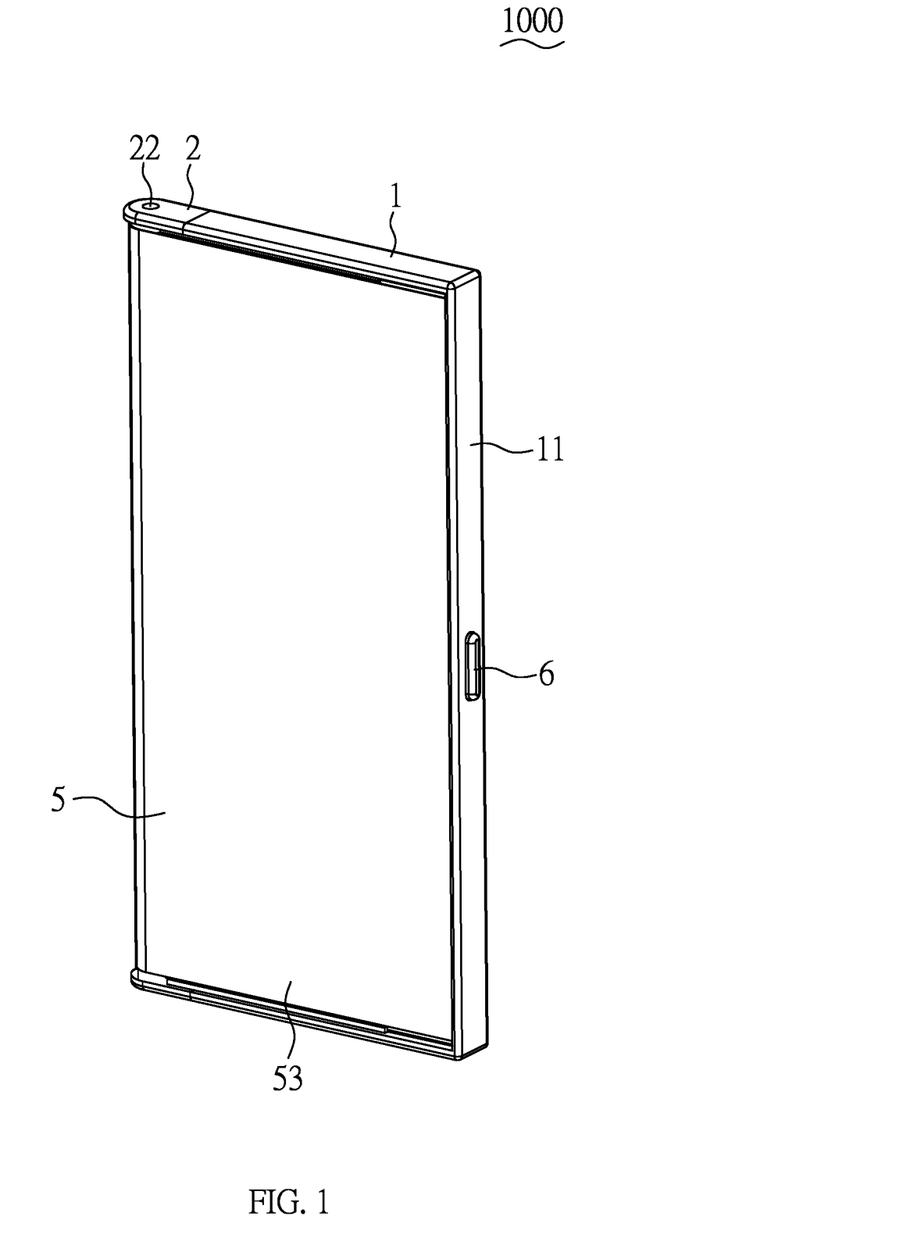
FIG. 1 is a schematic view of the retractable screen mobile device in the retracted state according to the present invention.
Figure 2:
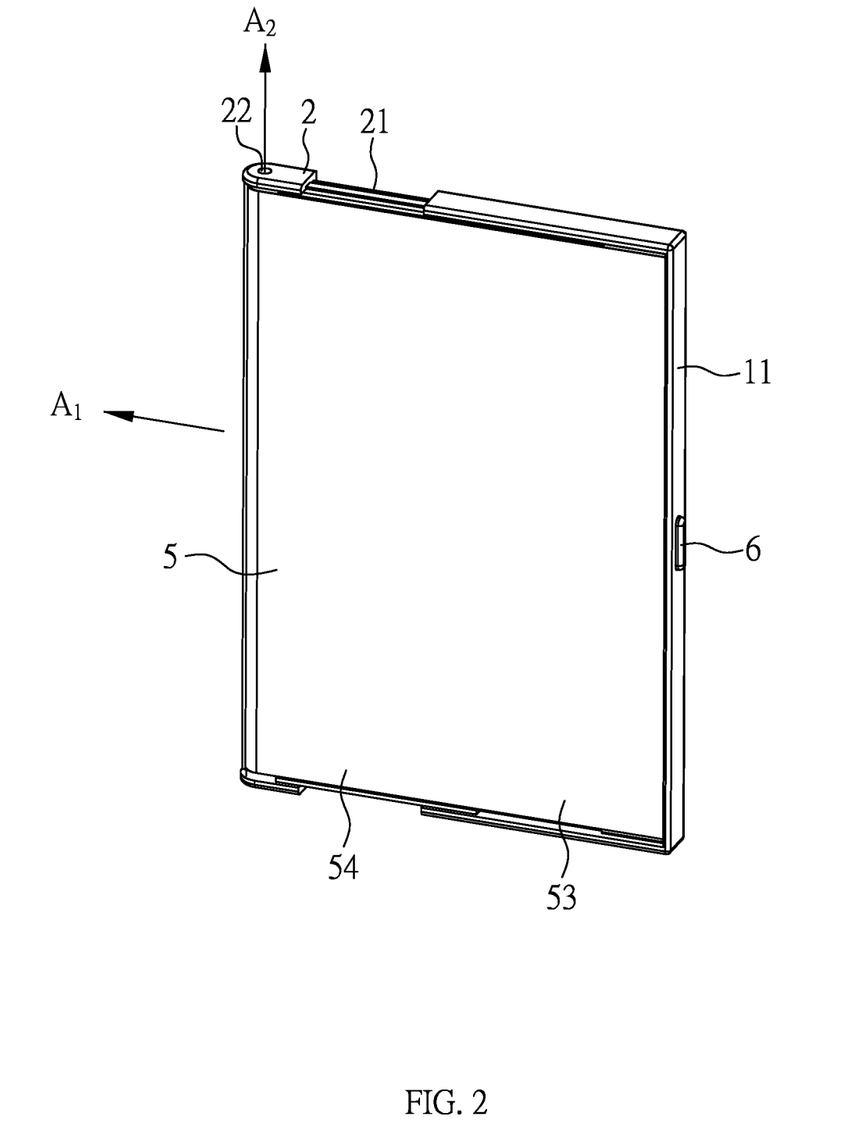
FIG. 2 is a schematic view of the retractable screen mobile device in the outstretched state according to the present invention.
Figure 3:
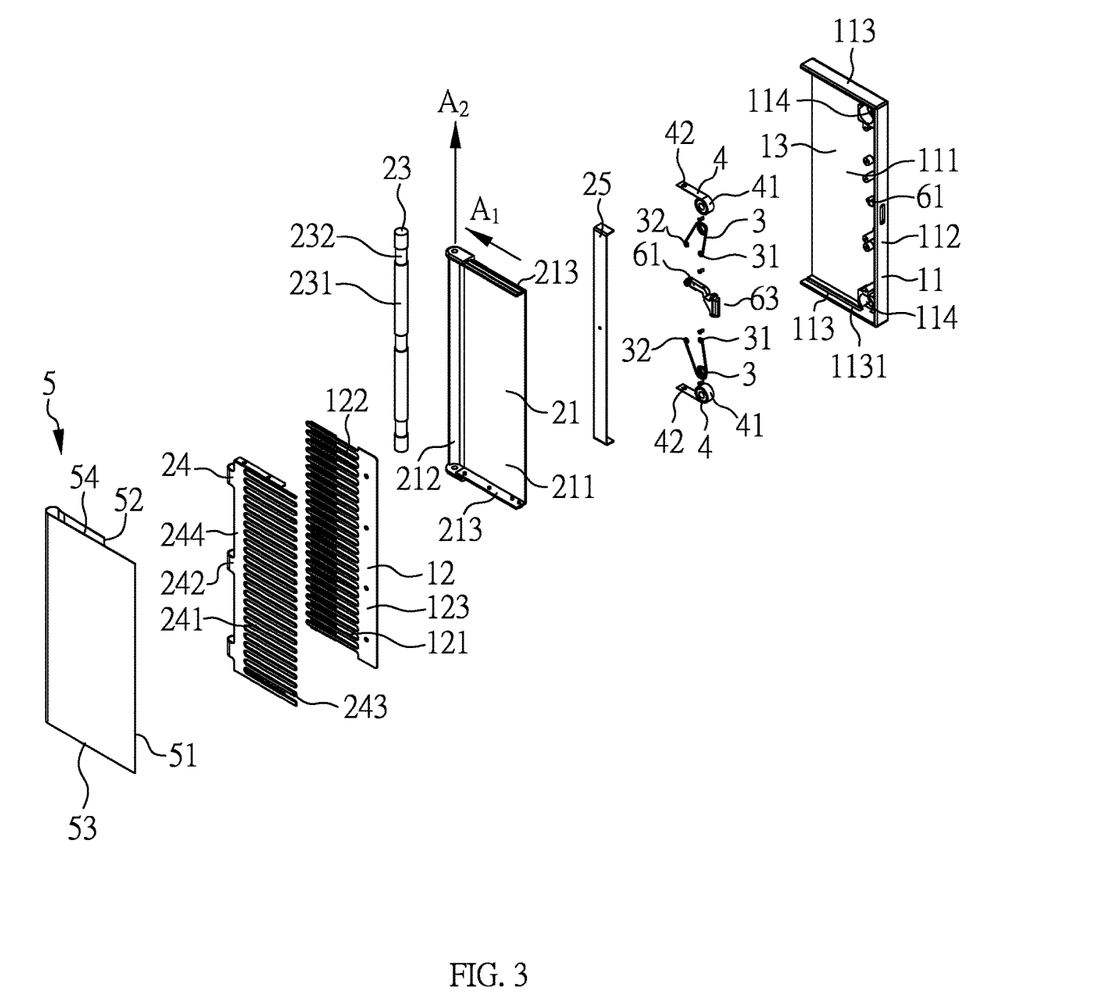
FIG. 3 is an exploded view of the retractable screen mobile device according to the present invention.

The schematic diagrams of the retractable screen mobile device 1000 of the present invention in the retracted state and the outstretched state are shown in FIG. 1 and FIG. 2 respectively, and the exploded view is shown in FIG. 3. The retractable screen mobile device 1000 mainly includes a main unit 1, a retractable unit 2, two elastic members 3, two constant force springs 4, a flexible display screen 5, and a locking element 6.

The main unit 1 includes a first shell 11, a first supporting plate 12, an accommodating space 13, and a plurality of abutting plates 14. The first supporting plate 12 is disposed on the first shell 11. The accommodating space 13 is surrounded and defined by the first supporting plate 12 and the first shell 11. The first shell 11 has a main board 111, a sideboard 112, two slide rail boards 113, and two bases 114. The sideboard 112 and the slide rail boards 113 are disposed on the main board 111, and the slide rail boards 113 are correspondingly arranged, and each has a protruding rail 1131 for the retractable unit 2 to slide thereon. The first supporting plate 12 is fixed on the main board 111, and the first supporting plate 12, the main board 111, the side plate 112, and the slide rail boards 113 define the accommodating space 13 together. The abutting plates 14 are fixed on the first supporting plate 12.

Figure 4:
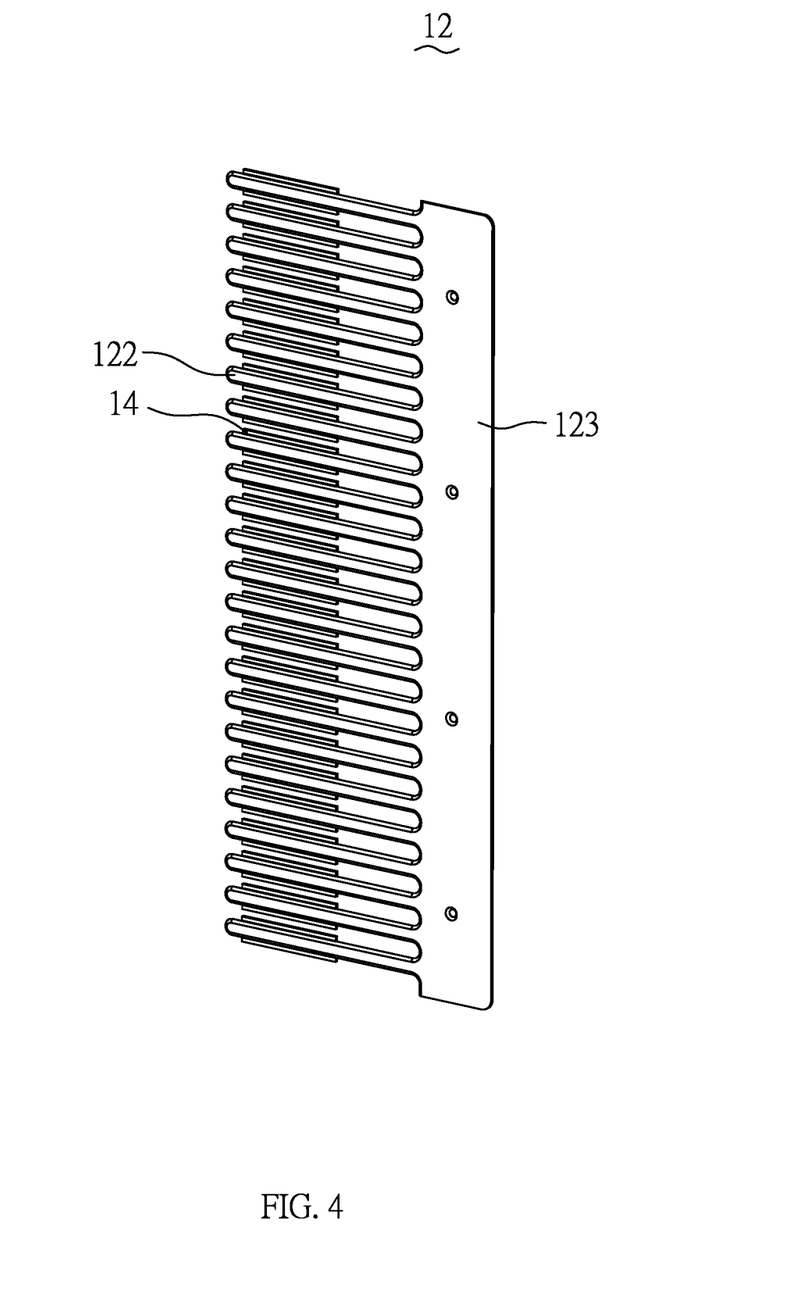
FIG. 4 is a schematic view of the first supporting plate according to the present invention.

Specifically, please refer to FIG. 3 and FIG. 4, the first supporting plate 12 has a first supporting surface 121, a plurality of first comb-tooth columns 122, and a first elongated plate 123. The first comb-tooth columns 122 are disposed on one side of the first elongated plate 123 and extend along the telescopic axis $A_1$, and a first gap 1221 is formed between two of the adjacent first comb-tooth columns 122. Each of the abutting plates 14 is correspondingly fixed to one of the first comb columns 122 and extends outwardly approximately perpendicular to the telescopic axis $A_1$.

In addition, the main unit 1 also includes a panel (not shown in figures) electrically connected to the flexible display screen 5, that is, a module of electronic components such as circuit boards or batteries, to provide the corresponding functions of the mobile device. Relevant details are not repeated here.

The retractable unit 2 is disposed on the main unit 1 and can be shifted relative to the main unit 1 along a telescopic axis $A_1$ between a retracted state (FIG. 1) and an outstretched state (FIG. 2).

Specifically, the retractable unit 2 includes a second shell 21, a damping element 22, a pivot 23, a second supporting plate 24, and a connecting plate 25, wherein the second shell 21 has a main body plate 211, an arc-shaped plate 212, and two slider plates 213. The arc-shaped plate 212 is disposed on the side of the main body plate 211 away from the first shell 11 and is used for the pivot 23 to be pivoted thereon. The slider plates 213 are correspondingly disposed on the main body plate 211 and have grooves 2131. The grooves 2131 are slidably assembled with the protruding rails 1131 of the slide rail plate 113, so the second shell 21 can slide relative to the first shell 11 along the telescopic axis $A_1$. The connecting plate 25 is disposed on the second shell 21.

Figure 5:
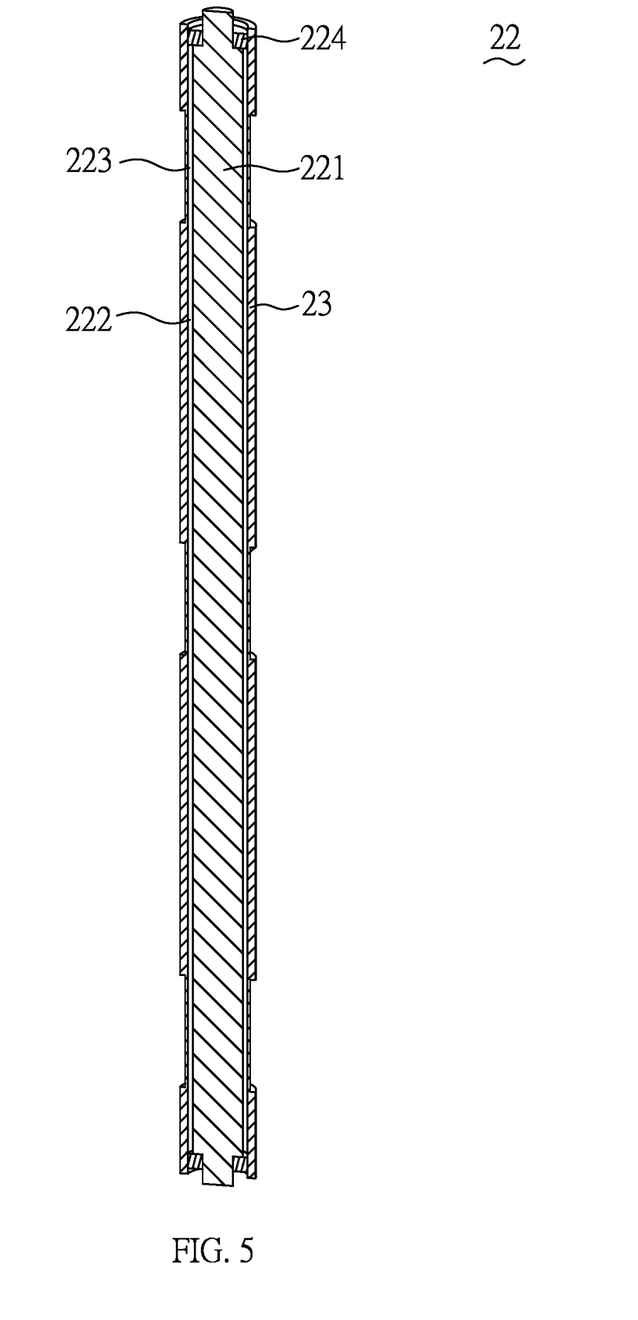
FIG. 5 is a sectional view of the pivot according to the present invention.

In the present embodiment, the damping element 22 is disposed in the pivot 23 and extends along a steering axis substantially perpendicular to the telescopic axis $A_1$. As shown in FIG. 5, the damping element 22 has an inner tube 221, a filling area 222, damping oil 223, and two oil seals 224. The inner tube 221 passes through the pivot 23, and two ends of the inner tube 221 are respectively fixed on the arc-shaped plate 212 of the second shell 21. The filling area 222 is sandwiched between the pivot 23 and the inner tube 221, the damping oil 223 is filled in the filling area 222, and the oil seals 224 are respectively disposed at two ends of the filling area 222 for sealing the damping oil 223 in the filling area 222. When the retractable unit 2 shifts with respect to the main unit 1 along the telescopic axis A1, the damping element 22 can provide a damping force as the pivot 23 pivotally rotates relative to the inner tube 221.

Two ends of the pivot 23 are pivoted on the arc-shaped plate 212 respectively and have a shaft body 231 and three hook grooves 232. The shaft body 231 extends along the steering axis $A_2$ substantially perpendicular to the telescopic axis $A_1$.

The second supporting plate 24 is disposed on the second shell 21 and has a second supporting surface 241, three hook parts 242, a plurality of second comb-tooth columns 243, and a second elongated plate 244. The second supporting surface 241 is coplanar to the first supporting surface 121; the hook parts 242 are formed on one side of the second elongated plate 244 away from the first elongated plate 123 and hung on the hook grooves 232 so that the second supporting plate 24 is hung on the pivot 23. The second comb-tooth columns 243 are disposed on another side of the second elongated plate 244 close to the first elongated plate 123. A width of each of the second comb-tooth columns 243 is slightly smaller than a width of the first gap 1221, the first comb-tooth column 122 and the second comb-tooth column 243 are correspondingly staggered and can slide relative to each other. The second comb-tooth columns 243 are supported by the corresponding abutting plates 14, so that the second supporting surface 241 is constantly coplanar with the first supporting surface 121.

Each of the elastic members 3 is a torsional spring, including a first end 31 and a second end 32. The first end 31 is fixed on the first shell 11 of the main unit 1, and the second end 32 is fixed on the second shell 21 of the retractable unit 2. The elastic member 3 tends to keep the main unit 1 and the retractable unit 2 in the outstretched state.

Each of the constant force springs 4 includes a winding part 41 and a telescopic part 42. The winding part 41 is disposed on the base 114, and the telescopic part 42 is fixed on the flexible display screen 5. The constant force springs 4 provide constant tension on the flexible display screen 5.

The flexible display screen 5 includes a fixed end 51, a free end 52, a fixed display area 53, and an extended display area 54. The fixed end 51 is disposed on the first shell 11, the free end 52 is fixed to the telescopic part 42 of the constant force springs 4. The flexible display screen 5 is tightened to maintain the tension by the constant force springs 4.

Figure 7:
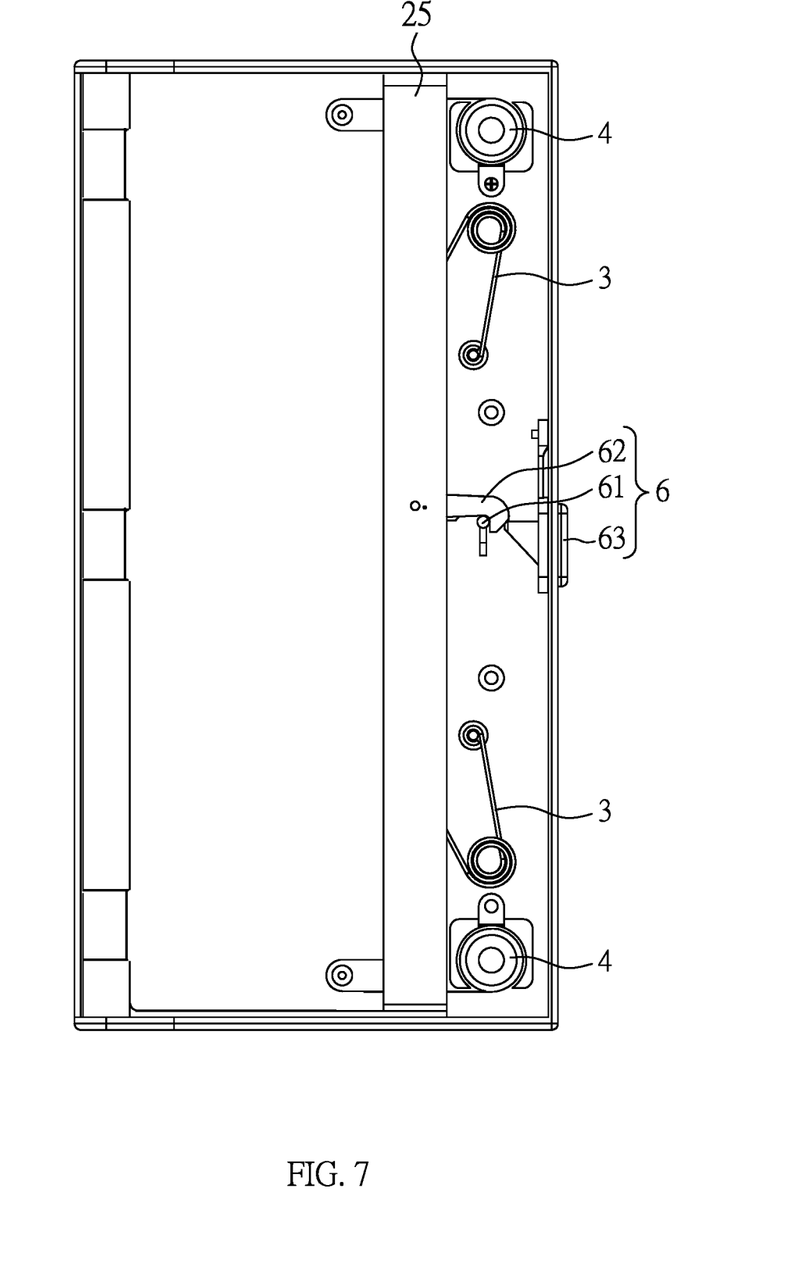
FIG. 7 is a partial schematic view of the locking element in the locked state according to the present invention.
Figure 9:
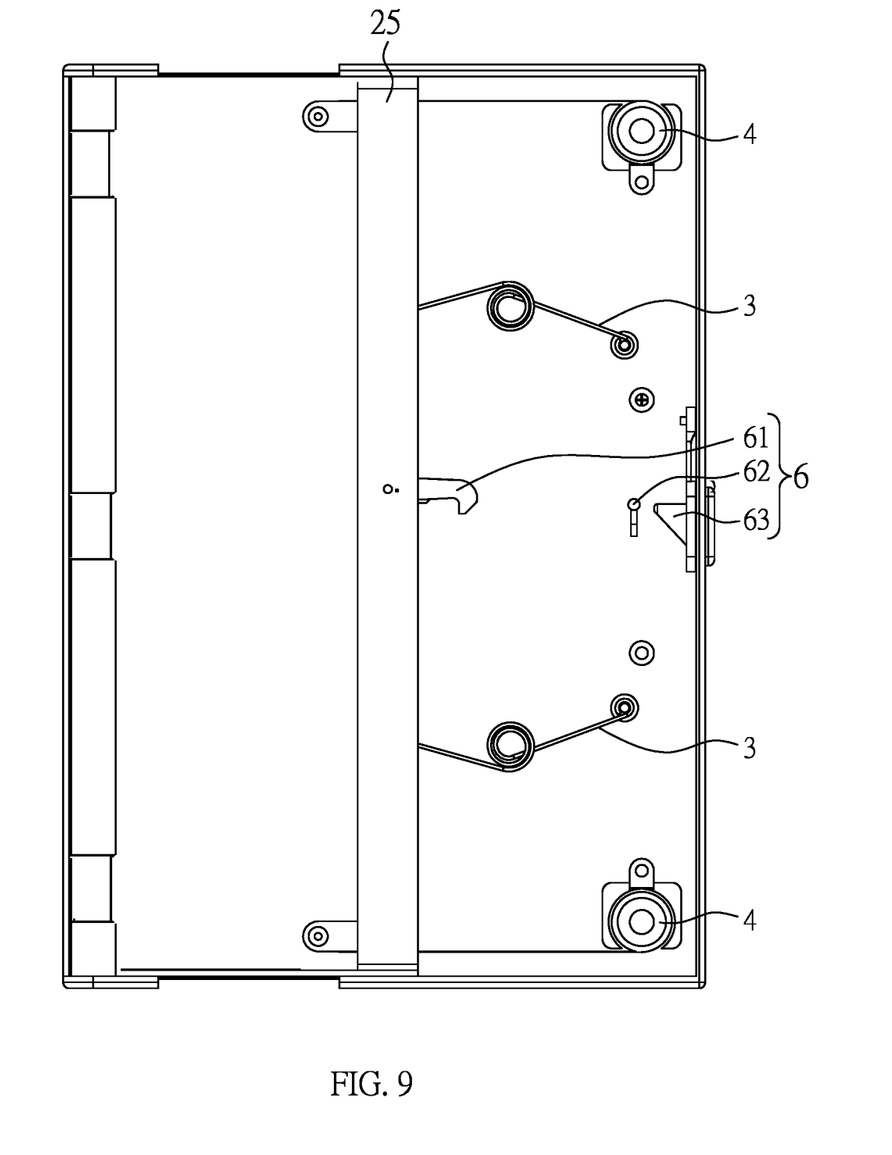
FIG. 9 is a partial schematic view of the locking element in the unlocked state according to the present invention.

The locking element 6 includes a hook 61, a tenon 62, and a button 63, wherein the hook 61 is disposed on the connecting plate 25, the tenon 62 and the button 63 are disposed on the first shell 11. In a locked state as shown in FIG. 7, the hook 61 and the tenon 62 are engaged with each other (that is, the hook 61 is hooked on the tenon 62). The hook 61 can be pushed by pressing the button 63 to separate the hook 61 from the tenon 62 and switch to an unlocked state as shown in FIG. 9.

Figure 6:
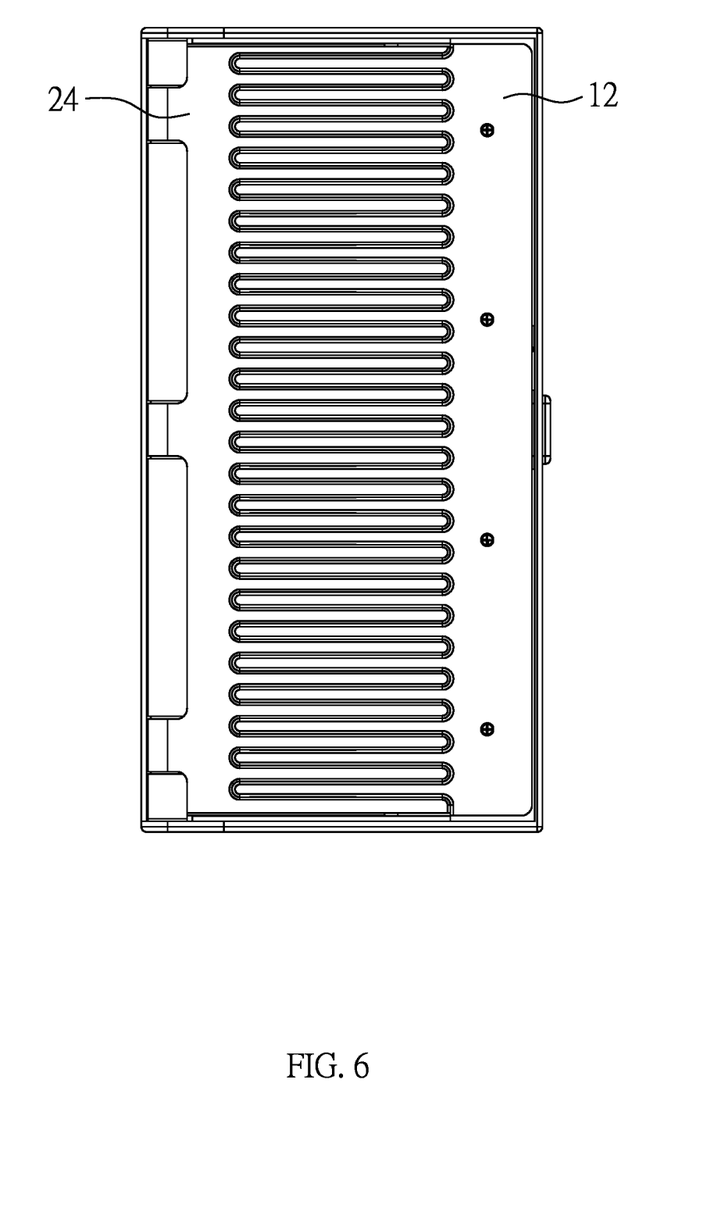
FIG. 6 is a schematic view of the second supporting plate in the assembly position according to the present invention.
Figure 8:
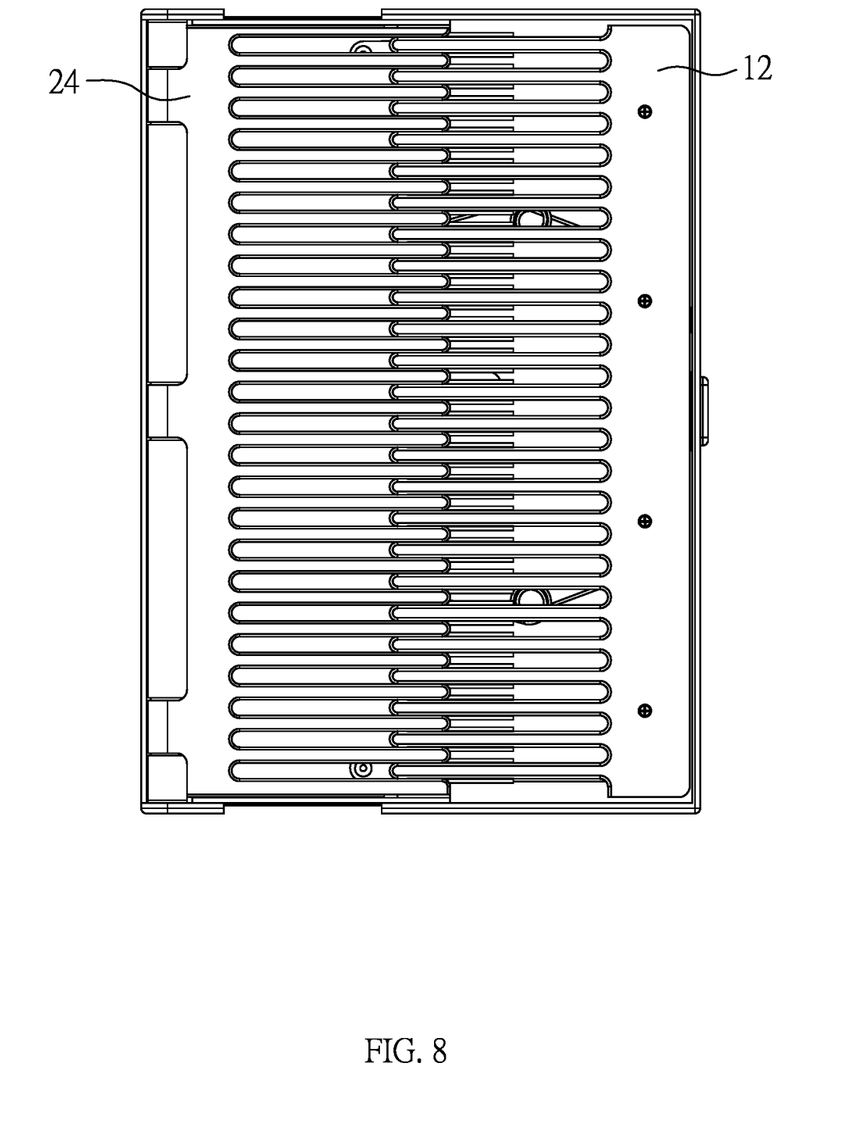
FIG. 8 is a schematic view of the second supporting plate in the extended position according to the present invention.

Specifically, as shown in FIG. 1 and FIG. 6, when the retractable unit 2 is in the retracted state, the pivot 23 and the first shell 11 are closest to each other. As shown in FIG. 2 and FIG. 8, the second support plate 24 is in an assembly position. The first comb-tooth column 122 and the second comb-tooth column 243 are completely complementary to each other and define a minimum area together, and the first support surface 121 and the second support surface 241 are substantially overlapped and jointly support the flexible display screen 5.

In the meantime, the fixed display area 53 of the flexible display screen 5 is mainly supported by the first supporting surface 121 (partially supported by the second supporting surface 241, and the extended display area 54 is partially wound around the pivot 23 and partially accommodated in the accommodating space 13. At this point, the locking element 6 is in the locked state, so that the retractable unit 2 can be maintained in the retracted state.

When the retractable unit 2 is to be converted from the retracted state to the outstretched state to increase the display area of the flexible display screen 5, the user can press the button 63 of the locking element 6 to separate the hook 61 from the tenon 62 and switched to the unlocked state. At this time, the elastic member 3 provides an elastic force to push the second shell 21 to slide along the telescopic axis $A_1$ relative to the first shell 11 until the pivot 23 and the first shell 11 are farthest away from each other. The second supporting plate 24 is in an extended position, the first comb-tooth columns 122 and the second comb-tooth columns are partially engaged and jointly define a maximum area to support the flexible display screen 5.

Specifically, when the second shell 21 slides relative to the first shell 11 along the telescopic axis $A_1$, the pivot 23 gradually moves away from the first shell 11, and the pivot 23 drives the extended display area 54 of the flexible display screen 5, which is wound and deflected around the pivot 23, to leave the accommodating space 13 and be supported by the second supporting plate 24 until the retractable unit 2 reaches the outstretched state as shown in FIG. 2 and FIG. 8. After the outstretched state is reached, the flexible display screen 5 is jointly supported by the first supporting surface 121 and the second supporting surface 241. Specifically, the fixed display area 53 of the flexible display screen 5 is supported by the first supporting surface 121, a part of the extended display area 54 is supported by the second supporting surface 241, and a part of the extended display area 54 is wound around the pivot 23. At this point, the area of the flexible display screen 5 that the user can use is increased.

When the retractable unit 2 is to be converted from the outstretched state to the retracted state for restoring the display area of the flexible display screen 5, the user can force the pivot 23 to move along the direction toward the main unit 1 for resisting the elastic force provided by the elastic members 3. Accordingly, the second shell 21 may slide along the telescopic axis $A_1$ toward the first shell 11. At this time, the first comb-tooth columns and the second comb-tooth columns move to each other until they are completely engaged with each other, and the second supporting plate 24 returns to the assembled position. Due to the force provided by the constant force spring 4, the extended display area 54 of the flexible display screen 5 is pulled into the accommodating space 13 until the hook 61 and the tenon 62 of the locking element 6 are in engaged with each other, the retractable unit 2 returns to the retracted state.

Since the damping element 22 is disposed in the pivot 23, the pivot 23 provides the damping force to prevent the retractable unit 2 from moving too fast relative to the main unit 1 which may cause damage to the components when the pivot 23 rotates relative to the inner tube 221 of the damping element 22 when the retractable unit 2 moves back and forth relative to the main unit 1 to make the flexible display screen 5 move around the pivot 23. Also, it can provide a harmonious and smooth operating feel to improve the quality and value of the product for the user.

In other embodiment of the present invention, the damping element 2 can be a damping rod disposed between the first shell 11 and the second shell 21 and provides a damping force when the retractable unit 2 moves with respect to the main unit 1 to achieve the same operation feeling effect. In this embodiment, the pivot 23 can be a rotating shaft known in the art.

Although the present invention has been described in considerable detail with reference to certain embodiments thereof, other embodiments are possible. Therefore, the spirit and scope of the appended claims should not be limited to the description of the embodiments contained herein.

What is claimed is:

1. A retractable screen mobile device, comprising:
   a main unit including a first shell, a first supporting plate, and an accommodating space, wherein the first supporting plate is disposed on the first shell and has a first supporting surface and a plurality of first comb-tooth columns, the first comb-tooth columns extend along a telescopic axis and a first gap is formed between two adjacent first comb-tooth columns, and the accommodating space is surrounded and defined by the first shell and the first supporting plate;
   a retractable unit slidably disposed on the main unit along the telescopic axis and being able to convert between a retracted state and an outstretched state with respect to the main unit, wherein the retractable unit includes a second shell, a damping element, a pivot, a second supporting plate, and a connecting plate, wherein the damping element connects the second shell; the connecting plate is disposed on the second shell; the second supporting plate is hung on the pivot and having a second supporting surface and a plurality of second comb-tooth columns, and wherein the second supporting surface and the first supporting surface are coplanar to each other, a width of each of the second comb-tooth columns is slightly smaller than a width of the first gap, and the first comb-tooth column and the second comb-tooth column are correspondingly staggered and can slide relative to each other;
   an elastic member with two ends respectively disposed on the main unit and the retractable unit;
   at least one constant force spring including a winding part and a telescopic part, wherein the winding part is disposed on the first shell; and
   a flexible display screen including a fixed end and a free end, wherein the fixed end is disposed on the first supporting plate, the flexible display screen covers the first supporting surface and is wound and deflected around the pivot, and the free end is fixed to the telescopic part of the constant force spring, and wherein the constant force spring provides constant tension to the flexible display screen;
   wherein the pivot and the first shell are closest to each other and the second supporting plate is in a assembly position, the first comb-tooth columns and the second comb-tooth columns are completely complementary and jointly define a minimal area, and the first supporting surface and the second supporting surface substantially coincide and jointly support the flexible display screen when the retractable unit is in the retracted state; wherein the pivot and the first shell are farthest away from each other, the second supporting plate is in an extended position, the first comb-tooth columns and the second comb-tooth columns are partially engaged and jointly define a maximum area, and the first supporting surface and the second supporting surface partially coincide to each other and jointly support the flexible display screen when the retractable unit is in the outstretched state; and wherein the damping element provides a damping force when the retractable unit moves with respect to the main unit.

2. The retractable screen mobile device claimed in claim 1, wherein the damping element is disposed in the pivot and extended in a steering axis, which is substantially perpendicular to the telescopic axis, and has an inner tube, and wherein the inner tube passes through the pivot and two ends of the inner tube are respectively fixed on the second shell, and the second supporting plate is hung on the pivot so that the pivot rotates relative to the inner tube and provides the damping force when the retractable unit moves along the telescopic axis with respect to the main unit.

3. The retractable screen mobile device claimed in claim 2, wherein the damping element further has a filling area, a damping oil, and two oil seals, and wherein the filling area is sandwiched between the pivot and the inner tube, the damping oil is filled in the filling area, and the oil seals are respectively disposed at both ends of the filling area to seal the damping oil in the filling area.

4. The retractable screen mobile device claimed in claim 1, wherein the damping element is a damping rod, and the damping rod abuts between the first shell and the second shell and provides the damping force when the retractable unit moves along the telescopic axis with respect to the main unit.

5. The retractable screen mobile device claimed in claim 1, wherein the second supporting plate has at least one hook part, and the pivot has at least one hook groove for the at least one hook part to correspondingly hung thereon.

6. The retractable screen mobile device claimed in claim 5, wherein the main unit further has a plurality of abutting plates, and each of the abutting plates is correspondingly disposed on one of the first comb-tooth columns and extends along outwardly perpendicular to the telescopic axis to support each of the second comb-tooth columns respectively.

7. The retractable screen mobile device claimed in claim 6, wherein the first supporting plate further has a first elongated plate, the second supporting plate further has a second elongated plate, the first comb-tooth columns are disposed on one side of the first elongated plate, the second comb-tooth columns are disposed on one side of the second elongated plate that adjacent to the first elongated plate, and the at least one hook part is disposed on another side of the second elongated plate that is away from the first elongated plate.

8. The retractable screen mobile device claimed in claim 7, wherein a distance between the first elongated plate and the second elongated plate is the smallest when the retractable unit is in the retracted state; and wherein the distance between the first elongated plate and the second elongated plate is the largest when the retractable unit is in the outstretched state.

9. The retractable screen mobile device claimed in claim 8, wherein the elastic member includes a first end and a second end, the first end is fixed on the first shell, the second end is fixed on the retractable unit, and the elastic member tends to maintain the retractable unit in the outstretched state.

10. The retractable screen mobile device claimed in claim 9, wherein the flexible display screen includes a fixed display area and an extended display area, wherein the fixed display area is constantly supported by the first supporting surface, the extended display area is partially supported by the second supporting surface and partially wound around the pivot when the retractable unit is in the outstretched state; and the extended display area is partially wound around the pivot and partially accommodated in the accommodating space when the retractable unit is in the retracted state.

11. The retractable screen mobile device claimed in claim 10, further comprising a locking element, wherein when the locking element is in a locked state, the retractable unit is kept in the retracted state, and when the locking element is in an unlocked state, the elastic member pushes the retractable unit so that the retractable unit tends to remain in the outstretched state.

12. The retractable screen mobile device claimed in claim 11, wherein the locking element includes a hook, a tenon, and a button, wherein the hook is attached to the connecting plate, the tenon and the button are disposed on the first shell; and wherein the hook and the tenon are engaged with each other in the locked state, and the hook and the tenon are separated and switched to the unlocked state when the button is pressed.

13. The retractable screen mobile device claimed in claim 12, wherein the elastic member is a torsional spring with two ends respectively disposed on the first shell and the second shell.

* * * * *